United States Patent
Jin et al.

(10) Patent No.: US 12,027,641 B2
(45) Date of Patent: Jul. 2, 2024

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Guangming Liao, Zhejiang (CN)

(73) Assignees: ZHEJIANG JINKO SOLAR CO., LTD., Zhejiag (CN); JINKO SOLAR CO., LTD., Jiangxi (CN)

( * ) Notice: Subject to any disclaimer, the term of this patent is extended or adjusted under 35 U.S.C. 154(b) by 2 days.

(21) Appl. No.: 18/178,228

(22) Filed: Mar. 3, 2023

(65) Prior Publication Data
US 2024/0178336 A1  May 30, 2024

(30) Foreign Application Priority Data
Nov. 30, 2022 (CN) .......................... 202211544085.0

(51) Int. Cl.
*H01L 31/077* (2012.01)
*H01L 31/02* (2006.01)
(Continued)

(52) U.S. Cl.
CPC ...... *H01L 31/077* (2013.01); *H01L 31/02008* (2013.01); *H01L 31/02167* (2013.01);
(Continued)

(58) Field of Classification Search
CPC ..... H01L 31/022167; H01L 31/022168; H01L 31/048; H01L 31/077
See application file for complete search history.

(56) References Cited

U.S. PATENT DOCUMENTS

2008/0041434 A1* 2/2008 Adriani ................... H02S 40/36
136/244
2014/0299187 A1* 10/2014 Chang ............... H01L 31/02168
136/258
(Continued)

FOREIGN PATENT DOCUMENTS

CN 110838528 A 2/2020
EP 3026713 A1 1/2016
(Continued)

OTHER PUBLICATIONS

European Search Report for Appl. No. 23159295.7-1002; Applicant Zhejiang Jinko Solar Co., Ltd et al., dated Aug. 22, 2023.

*Primary Examiner* — Lindsey A Buck
(74) *Attorney, Agent, or Firm* — TAROLLI, SUNDHEIM, COVELL & TUMMINO L.L.P.

(57) ABSTRACT

A solar cell and a photovoltaic module. The solar cell includes: a substrate including a first surface; a tunneling oxide layer covering the first surface; a doped conductive layer covering a surface of the tunneling oxide layer away from the substrate; an intrinsic polycrystalline silicon layer formed on one side of the doped conductive layer away from the tunneling oxide layer; and a plurality of first electrodes arranged on one side of the intrinsic polycrystalline silicon layer away from the doped conductive layer and electrically connected to the doped conductive layer. At least a portion of the first electrode is located in the intrinsic polycrystalline silicon layer, and a gap is defined between a top end of the first electrode and the substrate.

15 Claims, 3 Drawing Sheets (51) Int. Cl.
  *H01L 31/0216*  (2014.01)
  *H01L 31/0224*  (2006.01)
  *H01L 31/028*  (2006.01)
  *H01L 31/048*  (2014.01)
  *H01L 31/05*  (2014.01)

(52) U.S. Cl.
  CPC ............... *H01L 31/02168* (2013.01); *H01L 31/022425* (2013.01); *H01L 31/028* (2013.01); *H01L 31/048* (2013.01); *H01L 31/0512* (2013.01)

(56) References Cited

U.S. PATENT DOCUMENTS

2019/0172957 A1* 6/2019 Anker ................ H01L 31/1804
2020/0279968 A1   9/2020 Bende

FOREIGN PATENT DOCUMENTS

EP           4084086 A1   2/2022
KR       20150109745 A   10/2015

\* cited by examiner

SOLAR CELL AND PHOTOVOLTAIC MODULE

CROSS-REFERENCE TO RELATED APPLICATIONS

The present application claims priority to Chinese Patent Application No. 202211544085.0, filed on Nov. 30, 2022, the content of which is incorporated herein by reference in its entirety.

TECHNICAL FIELD

The present disclosure relates to the technical field of solar cells and, in particular, to a solar cell and a photovoltaic module.

BACKGROUND

Solar cells can directly convert solar radiation energy into electrical energy. In order to suppress carrier recombination on surface of the substrate of the solar cell, a tunneling oxide layer and a doped conductive layer may generally be manufactured on the surface of the substrate to enhance the passivation effect to the substrate.

In the related art, an electrode of the solar cell easily penetrates through the tunneling oxide layer to contact the substrate, resulting in destruction of the passivation effect on the surface of the substrate, thus increasing the carrier recombination, and affecting photoelectric conversion efficiency of the solar cells.

SUMMARY

The present disclosure provides a solar cell and a photovoltaic module, which can improve the photoelectric conversion efficiency of the solar cells.

In a first aspect of the present disclosure, a solar cell is provided, the solar cell includes: a substrate including a first surface; a tunneling oxide layer covering the first surface; a doped conductive layer covering a surface of the tunneling oxide layer away from the substrate; an intrinsic polycrystalline silicon layer formed on one side of the doped conductive layer away from the tunneling oxide layer; and a plurality of first electrodes arranged on one side of the intrinsic polycrystalline silicon layer away from the doped conductive layer and electrically connected to the doped conductive layer. At least a portion of the first electrode is located in the intrinsic polycrystalline silicon layer, and a gap is defined between a top end of the first electrode and the substrate.

In one or more embodiments, the intrinsic polycrystalline silicon layer covers an entire surface of the doped conductive layer away from the tunneling oxide layer.

In one or more embodiments, the solar cell further includes a first passivation layer covering a surface of the intrinsic polycrystalline silicon layer away from the doped conductive layer.

In one or more embodiments, the intrinsic polycrystalline silicon layer includes a plurality of covering portions, and the covering portions cover a surface of the doped conductive layer away from the tunneling oxide layer. The covering portions cover parts of the doped conductive layer corresponding to the first electrodes, respectively.

In one or more embodiments, the solar cell further includes a first passivation layer, one part of the first passivation layer covers a part of the doped conductive layer not provided with the covering portion, and the other part of the first passivation layer covers a surface of the covering portion away from the doped conductive layer.

In one or more embodiments, a thickness D1 of the intrinsic polycrystalline silicon layer satisfies: 10 nm≤D1≤80 nm.

In one or more embodiments, the solar cell further includes a local doped region connected to the first electrode, the intrinsic polycrystalline silicon layer, and the doped conductive layer, respectively, so that the first electrode is electrically connected to the doped conductive layer.

In one or more embodiments, the first electrode is a metal electrode, the first electrode and the doped conductive layer have doping elements of a same conductivity type, and a doping concentration of the first electrode is greater than the doped conductive layer. The doping element in the first electrode permeates toward the doped conductive layer to form the local doped region.

In one or more embodiments, a concentration of the doping element in the doped conductive layer ranges from $1 \times 10^{20}$ atoms/cm$^3$ to $1 \times 10^{21}$ atoms/cm$^3$.

In one or more embodiments, a concentration of the doping element in the local doped region ranges from $1 \times 10^{19}$ atoms/cm$^3$ to $1 \times 10^{20}$ atoms/cm$^3$.

In one or more embodiments, the first electrode and the substrate have doping elements of a same conductivity type.

In one or more embodiments, the first electrode and the substrate have doping elements of different conductivity types.

In one or more embodiments, a cross-sectional area of the local doped region ranges from $1 \times 10^{-8}$ mm$^2$ to $1 \times 10^{-6}$ mm$^2$.

In one or more embodiments, the first electrode includes a body portion and an extension portion extending along the body portion toward the doped conductive layer. The extension portion is located in the intrinsic polycrystalline silicon layer and/or the doped conductive layer, a gap is defined between a top end of the extension portion and the substrate, and the local doped region covers the extension portion.

In one or more embodiments, the extension portion includes a first part and a second part, the first part is connected to the body portion, and a gap is defined between the second part and both the body portion and the first part. One part of the local doped region covers the first part, and the other part of the local doped region covers the second part.

In one or more embodiments, a thickness D2 of the doped conductive layer satisfies: 10 nm≤D2≤80 nm.

In one or more embodiments, the substrate further includes a second surface arranged opposite to the first surface. The solar cell further includes: an emitter arranged on the second surface; a plurality of second electrodes arranged on one side of the emitter away from the substrate and electrically connected to the emitter; and a second passivation layer covering a surface of the emitter away from the substrate.

In a second aspect of the present disclosure, a photovoltaic module is provided, the photovoltaic module includes: at least one solar cell string formed by connecting a plurality of solar cells as described in the above aspect; at least one packaging layer configured to cover a surface of the solar cell string; and at least one cover plate configured to cover a surface of the packaging layer away from the solar cell string.

It should be understood that the general description above and the detailed description in the following are merely exemplary and cannot limit the present disclosure.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

In order to better understand the technical solution of the present disclosure, embodiments of the present disclosure are described in detail below with reference to the accompanying drawings.

It should be made clear that the embodiments described are only some rather than all of the embodiments of the present disclosure. All other embodiments acquired by those of ordinary skill in the art without creative efforts based on the embodiments in the present disclosure fall within the protection scope of the present disclosure.

The terms used in the embodiments of the present disclosure are intended to describe particular embodiments and are not intended to limit the present disclosure. As used in the specification of the present disclosure and the appended claims, the singular forms of "a/an", "the", and "said" are intended to include plural forms, unless otherwise clearly specified in the context.

It should be understood that the term "and/or" used herein only describes an association relationship between associated objects and represents that three relationships may exist. For example, A and/or B may represent the following three cases: only A exists, both A and B exist, and only B exists. In addition, the character "/" herein generally means that associated objects are in an "or" relationship.

It is to be noted that positional terms such as "above", "below", "left", and "right" described in the embodiments of the present disclosure are described from the perspective shown in the drawings and should not be construed as limiting the embodiments of the present disclosure. In addition, in the context, it should be further understood that, when an element is referred to as "above" or "below" another element, it can be directly connected "above" or "below" another element, and can also be indirectly connected "above" or "below" another element through an intermediate element.

In the related art, when a solar cell is manufactured, a tunneling oxide layer and a doped conductive layer may be formed on a surface of a substrate. The tunneling oxide layer can be used as a tunneling layer for majority carriers, and chemical passivation is conducted on the surface of the substrate at the same time to reduce interface states. The doped conductive layer can form energy band bending, realize selective transport of carriers, reduce loss caused by recombination, and ensure transport efficiency of the carriers. In addition, a metal electrode may also be manufactured on the surface of the substrate. The metal electrode is electrically connected to the doped conductive layer, and does not penetrate the tunneling oxide layer to maintain good interface passivation effect.

However, the doped conductive layer has light absorption capability, which may cause certain optical loss and reduce front cell efficiency and back cell efficiency of the solar cell, thereby reducing double-sided rate of the solar cell, resulting in reduced double-sided power generation rate when the solar cell is configured for double-sided power generation. In order to improve the above situation, the doped conductive layer may be thinned, thereby reducing the light absorption capability of the doped conductive layer, so as to reduce the optical loss and improve the cell efficiency of the solar cell. However, after the doped conductive layer is thinned, the metal electrode can easily penetrate the tunneling oxide layer and contact the substrate, resulting in destruction of the passivation effect on the surface of the substrate, thus increasing carrier recombination on the surface of the substrate, and leading to decrease of photoelectric conversion efficiency of the solar cell. Moreover, it is difficult to control an existing metal electrode manufacturing process to meet the requirement of "the metal electrode is in contact with the doped conductive layer, but does not penetrate the tunneling oxide layer".

Figure 1:
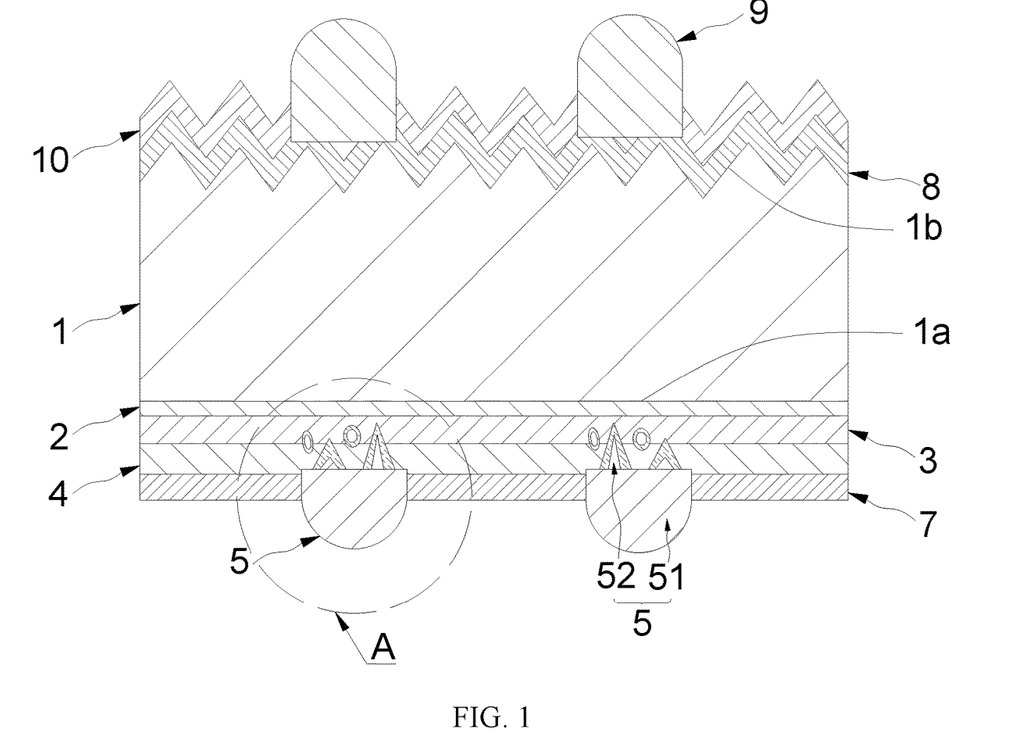
FIG. 1 is a schematic structural diagram of a cross-section of a solar cell according to one or more embodiments of the present disclosure.

Based on the above situation, some embodiments of the present disclosure provide a solar cell. The solar cell can reduce loss caused by recombination on the surface of the substrate and improve the photoelectric conversion efficiency of the solar cell. As shown in FIG. 1, the solar cell includes a substrate 1, a tunneling oxide layer 2, a doped conductive layer 3, an intrinsic polycrystalline silicon layer 4, and a first electrode 5. The substrate 1 has a first surface 1a. The tunneling oxide layer 2 covers the first surface 1a. The doped conductive layer 3 covers a surface of the tunneling oxide layer away from the substrate 1. The intrinsic polycrystalline silicon layer 4 is arranged on one side of the doped conductive layer 3 away from the tunneling oxide layer 2. A plurality of first electrodes 5 are arranged on one side of the intrinsic polycrystalline silicon layer 4 away from the doped conductive layer 3, and the plurality of first electrodes 5 are electrically connected to the doped conductive layer 3. At least part of the first electrode 5 is located in the intrinsic polycrystalline silicon layer 4, and a gap exists between a top end of the first electrode 5 and the substrate 1.

As shown in FIG. 1, the substrate 1 is configured to receive incident light and generate photo-generated carriers, the tunneling oxide layer 2 can perform chemical passivation to the first surface 1a and can reduce density of interface defects of the first surface 1a, thereby reducing recombination centers of the first surface 1a to reduce the carrier recombination rate. The doped conductive layer 3 is configured to form a field passivation layer, which can reduce concentration of minority carriers, thereby reducing the carrier recombination rate. The intrinsic polycrystalline silicon layer 4 is arranged on the side of the doped conductive layer 3 away from the tunneling oxide layer 2, which can increase the distance between the first electrode 5 and the tunneling oxide layer 2. At least part of the first electrode 5 can be in contact with the doped conductive layer 3 through the intrinsic polycrystalline silicon layer 4, and be electrically connected to the doped conductive layer 3. The existence of the gap between the top end of the first electrode 5 and the substrate 1 ensures that the first electrode 5 will not penetrate the tunneling oxide layer 2 and come into contact with the substrate 1, so that good interface passivation effect can be maintained at the first surface 1a.

In one or more embodiments, the arrangement of the intrinsic polycrystalline silicon layer 4 can prevent contact of the first electrode 5 with the substrate 1 due to penetration through the tunneling oxide layer 2, thereby preventing damages to the tunneling oxide layer 2, so that good interface passivation effect can be maintained at the first surface 1a, which prevents an increase in carrier recombination and then can improve the photoelectric conversion efficiency of the solar cell, increasing the front cell efficiency, the back cell efficiency, and thus increasing the double-sided rate of the solar cell. Moreover, the intrinsic polycrystalline silicon layer 4 is not doped, and has a light absorption coefficient much lower than the doped conductive layer 3. Therefore, the arrangement of the intrinsic polycrystalline silicon layer 4 can also reduce optical loss of the solar cell and improve utilization of light energy by the solar cell.

It is to be noted that the first electrode 5 not penetrating the tunneling oxide layer 2 includes a situation in which the first electrode 5 is not in contact with the tunneling oxide layer 2 and a situation in which part of the first electrode 5 extends into the tunneling oxide layer 2 but does not completely pass through the tunneling oxide layer 2.

In one or more embodiments, the substrate 1 may be a silicon substrate, including, but not limited to, a monocrystalline silicon substrate, a polycrystalline silicon substrate, a microcrystalline silicon substrate, a nanocrystalline silicon substrate, and the like.

In some embodiments, as shown in FIG. 1, the intrinsic polycrystalline silicon layer 4 covers an entire surface of the doped conductive layer 3 away from the tunneling oxide layer 2.

The intrinsic polycrystalline silicon layer 4 completely covers the surface of the doped conductive layer 3 away from the tunneling oxide layer 2, which can increase the distance between the first electrode 5 and the tunneling oxide layer 2. In the process of sintering electrode paste to form the first electrode 5, the top end of the first electrode 5 may first contact the intrinsic polycrystalline silicon layer 4 and then contact the doped conductive layer 3, which reduces the possibility that the first electrode 5 penetrates the tunneling oxide layer 2 and contacts the substrate 1.

In some embodiments, as shown in FIG. 1, the solar cell further includes a first passivation layer 7, and the first passivation layer 7 covers a surface of the intrinsic polycrystalline silicon layer 4 away from the doped conductive layer 3.

The first passivation layer 7 may play a role of performing passivation on the surface in contact therewith, and is configured to enhance the passivation effect of the solar cell, which can reduce recombination of carriers at the interface and improve transport efficiency of the carriers, thereby improving the photoelectric conversion efficiency of the solar cell. The first passivation layer 7 also has the function of reducing or eliminating reflected light on the surface of the solar cell and increasing a light transmission amount, which further improves the photoelectric conversion efficiency of the solar cell.

In some embodiments, the first passivation layer 7 may include components such as silicon oxide, silicon nitride, aluminum oxide, or silicon oxynitride. In addition, the first passivation layer 7 may have a single-layer structure or a multi-layer structure, and the refractive index and the thickness of each layer may be designed accordingly.

Figure 2:
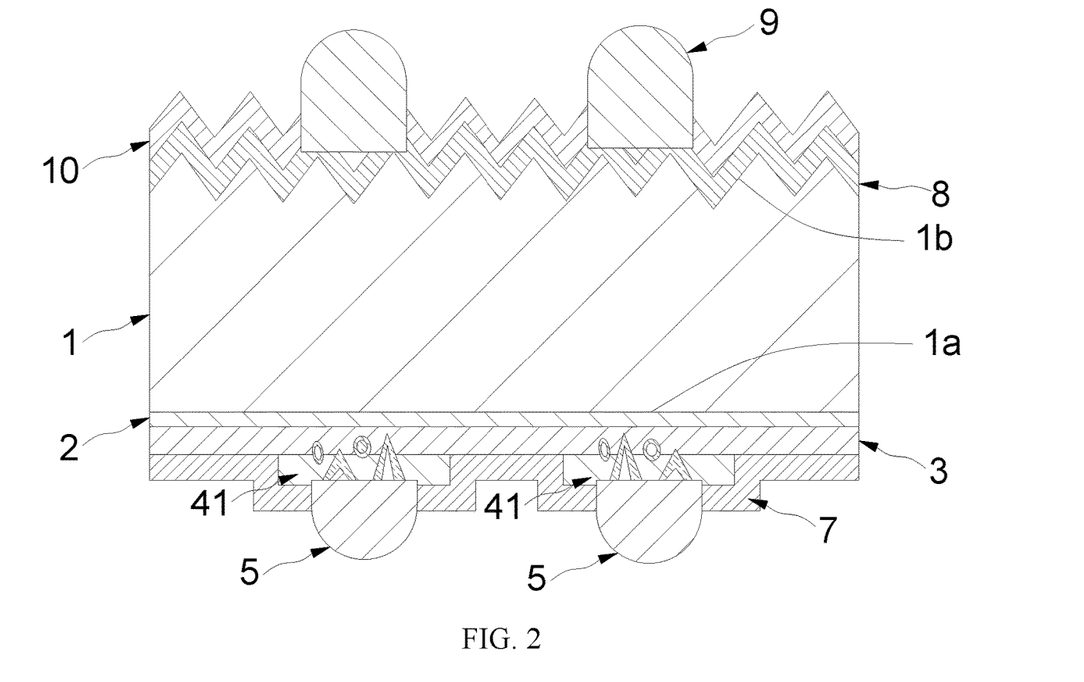
FIG. 2 is a schematic structural diagram of a cross-section of a solar cell according to some other embodiments of the present disclosure.

In addition, in some other embodiments, as shown in FIG. 2, the intrinsic polycrystalline silicon layer 4 includes a plurality of covering portions 41. The covering portions 41 are each configured to cover a surface of the doped conductive layer 3 away from the tunneling oxide layer 2, and the plurality of covering portions 41 cover parts of the doped conductive layer 3 corresponding to the plurality of first electrodes 5, respectively.

In one or more embodiments, the intrinsic polycrystalline silicon layer 4 is formed by a plurality of covering portions 41 spaced apart from one another. Each of the covering portions 41 covers part of a surface of the doped conductive layer 3 and can correspond to one of the plurality of first electrodes 5 to ensure that the first electrode 5 can first contact the covering portion 41 and then contact the doped conductive layer 3, which reduces the possibility that the first electrode 5 penetrates the tunneling oxide layer 2 and contacts the substrate 1. On this basis, the covering portions 41 spaced apart are beneficial to reduce the optical loss of the solar cell, so that more light is absorbed by the substrate 1, and more carriers are generated, thereby improving the photoelectric conversion efficiency of the solar cell. Costs for the arrangement of the intrinsic polycrystalline silicon layer 4 can also be reduced, thereby reducing manufacturing costs of the solar cell.

In some embodiments, as shown in FIG. 2, the solar cell further includes a first passivation layer 7, one part of the first passivation layer 7 covers a part of the doped conductive layer 3 not provided with the covering portion 41, and the other part of the first passivation layer 7 covers a surface of the covering portion 41 away from the doped conductive layer 3.

As shown in FIG. 2, the first passivation layer 7 can completely cover all exposed parts on the surface of the doped conductive layer 3 away from the tunneling oxide layer 2, and can also completely cover surfaces of the covering portions 41 away from the doped conductive layer 3 and side surfaces thereof, which can achieve good passivation effect, thereby reducing recombination of carriers on the surface, improving transport efficiency of the carriers, and then improving the photoelectric conversion efficiency of the solar cell.

Figure 3:
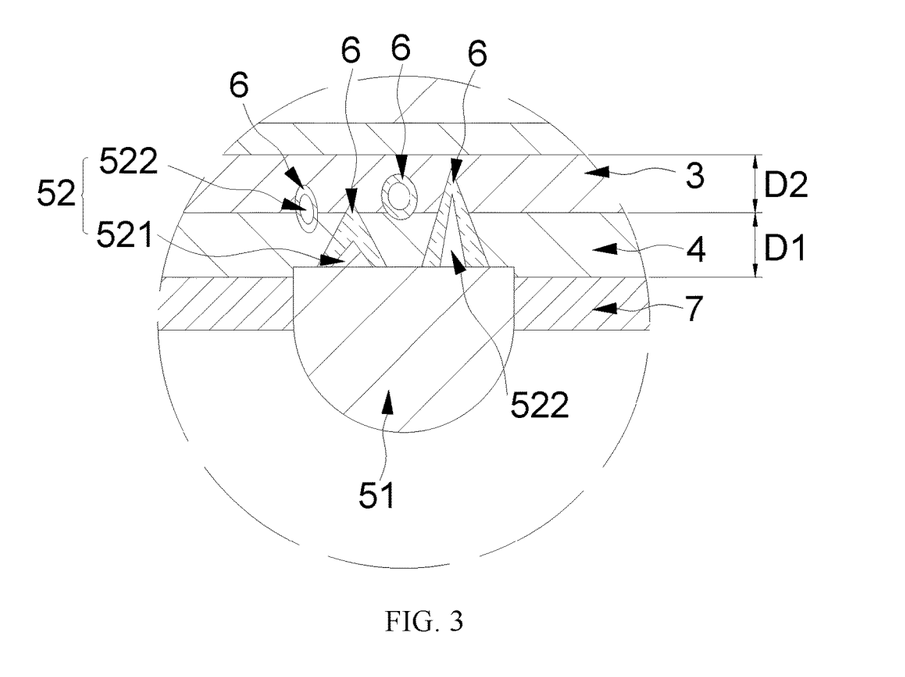
FIG. 3 is an enlarged view of Part A in FIG. 1.

In some embodiments, as shown in FIG. 3, a thickness D1 of the intrinsic polycrystalline silicon layer 4 satisfies: $10\ nm \leq D1 \leq 80\ nm$. For example, the thickness D1 of the intrinsic polycrystalline silicon layer 4 may be 10 nm, 30 nm, 50 nm, 70 nm, or 80 nm, or other values in the above range, which is not limited herein.

When D1 is excessively small (e.g., less than 10 nm), the intrinsic polycrystalline silicon layer 4 is excessively thin. As a result, the distance between the first electrode 5 and the tunneling oxide layer 2 is excessively small, and the first electrode 5 easily penetrates the tunneling oxide layer 2 and contacts the substrate 1, leading to an increase in recombination of the carriers and thus affecting the photoelectric conversion efficiency of the solar cell. When D1 is excessively large (e.g., greater than 80 nm), costs of the intrinsic polycrystalline silicon layer 4 may be increased, but the photoelectric conversion efficiency of the solar cell is not significantly improved. Therefore, when the thickness D1 of the intrinsic polycrystalline silicon layer 4 ranges from 10 nm to 80 nm, the photoelectric conversion efficiency of the solar cell can be improved, and the manufacturing costs of the solar cell can be reduced by a certain amount.

In some embodiments, as shown in FIG. 3, the solar cell further includes a local doped region 6. The local doped region 6 is connected to the first electrode 5, the intrinsic polycrystalline silicon layer 4, and the doped conductive layer 3, respectively, so that the first electrode 5 is electrically connected to the doped conductive layer 3.

The intrinsic polycrystalline silicon layer 4 includes no doping elements, and the intrinsic polycrystalline silicon layer 4 has weaker conductivity than the doped conductive layer 3. When the first electrode 5 does not penetrate the intrinsic polycrystalline silicon layer 4, that is, the first electrode 5 is in contact only with the intrinsic polycrystalline silicon layer 4 but not in contact with the doped conductive layer 3, an electrical connection between the first electrode 5 and the doped conductive layer 3 cannot be realized, resulting in reduction in the carrier transport rate. Therefore, there is a need to arrange the local doped region 6 with stronger conductivity to implement the electrical connection between the first electrode 5 and the doped conductive layer 3.

In some embodiments, as shown in FIG. 3, the local doped region 6 is located in regions of the intrinsic polycrystalline silicon layer 4 and the doped conductive layer 3. When the first electrode 5 does not penetrate the intrinsic polycrystalline silicon layer 4, the local doped region 6 can be connected to the first electrode 5, the intrinsic polycrystalline silicon layer 4, and the doped conductive layer 3 respectively, so as to realize the electrical connection between the first electrode 5 and the doped conductive layer 3 and increase the carrier transport rate. When the first electrode 5 penetrates the intrinsic polycrystalline silicon layer 4 and contacts the doped conductive layer 3 to form the electrical connection, the local doped region 6 can improve conduction efficiency between the first electrode 5 and the doped conductive layer 3 on this basis, thereby increasing the carrier transport rate.

In some embodiments, the first electrode 5 is a metal electrode, the first electrode 5 and the doped conductive layer 3 have doping elements of a same conductivity type, and doping concentration of the first electrode 5 is greater than the doped conductive layer 3. The doping element in the first electrode 5 permeates toward the doped conductive layer 3 to form the local doped region 6.

When the first electrode 5 and the doped conductive layer 3 have the doping elements of the same conductivity type and the doping concentration of the first electrode 5 is greater than the doped conductive layer 3, in a high-temperature process of sintering the electrode paste, the doping elements can permeate along concentration gradient from high to low, so as to form, at the intrinsic polycrystalline silicon layer 4 and the doped conductive layer 3, the local doped region 6 extending along the first electrode 5 toward the doped conductive layer 3. After the local doped region 6 is formed in part of the region of the intrinsic polycrystalline silicon layer 4, conductivity of the region can be improved, which is beneficial to realize the electrical connection between the first electrode 5 and the doped conductive layer 3, thereby improving the performance of the solar cell.

In some embodiments, the doping element may be an N-type dopant including Group V elements such as phosphorus (P), arsenic (As), bismuth (Bi), and antimony (Sb), or a P-type dopant including Group III elements such as boron (B), aluminum (Al), gallium (Ga), and indium (In).

In addition, the first electrode 5 is sintered from metal electrode paste. A doping element in the metal electrode paste accounts for 0.01% to 5% of all components of the paste. For example, it may be 0.01%, 0.05%, 1%, 3%, or 5%, or other values in the above range, which is not limited herein.

After the local doped region 6 is formed, a ratio of doping concentration of the doping element in the local doped region 6 to doping concentration of the doping element in the doped conductive layer 3 ranges from 1:100 to 1:1, and may be 1:100, 1:80, 1:50, 1:30, or 1:1, or other values in the above range, which is not limited herein.

In some embodiments, concentration of the doping element in the doped conductive layer 3 ranges from $1\times10^{20}$ atoms/cm$^3$ to $1\times10^{21}$ atoms/cm$^3$, and concentration of the doping element in the local doped region 6 ranges from $1\times10^{19}$ atoms/cm$^3$ to $1\times10^{20}$ atoms/cm$^3$.

In some embodiments, the concentration of the doping element in the doped conductive layer 3 may be $1\times10^{20}$ atoms/cm$^3$, $0.3\times10^{21}$ atoms/cm$^3$, $0.5\times10^{21}$ atoms/cm$^3$, $0.8\times10^{21}$ atoms/cm$^3$, or $1\times10^{21}$ atoms/cm$^3$, or other values in the above range, which is not limited herein.

In some embodiments, the concentration of the doping element in the local doped region 6 may be $1\times10^{19}$ atoms/cm$^3$, $0.3\times10^{20}$ atoms/cm$^3$, $0.5\times10^{20}$ atoms/cm$^3$, $0.8\times10^{20}$ atoms/cm$^3$, or $1\times10^{20}$ atoms/cm$^3$, or other values in the above range, which is not limited herein.

When the concentration of the doping element in the doped conductive layer 3 and the concentration of the doping element in the local doped region 6 satisfy the above ranges respectively, a stable electrical connection relationship can be formed between the first electrode 5 and the doped conductive layer 3, so as to increase the carrier transport rate, thereby improving the performance of the solar cell.

In some embodiments, the first electrode 5 and the substrate 1 have the doping elements of a same conductivity type.

In one or more embodiments, the doping elements in the first electrode 5 and the substrate 1 are the same, which may be N-type dopants including Group V elements such as P, As, Bi, and Sb, or P-type dopants including Group III elements such as B, Al, Ga, and In.

In addition, in some other embodiments, the first electrode 5 and the substrate 1 have the doping elements of different conductivity types.

In one or more embodiments, the doping elements in the first electrode 5 and the substrate 1 are different, when the doping element in the substrate 1 is an N-type dopant including Group V elements such as P, As, Bi, and Sb, the doping element in the first electrode 5 is a P-type dopant including Group III elements such as B, Al, Ga, and In. In some embodiments, when the doping element in the substrate 1 is a P-type dopant including Group III elements such as B, Al, Ga, and In, the doping element in the first electrode 5 is an N-type dopant including Group V elements such as P, As, Bi, and Sb.

In some embodiments, a cross-sectional area of the local doped region 6 ranges from $1\times10^{-8}$ mm$^2$ to $1\times10^{-6}$ mm$^2$. For example, the cross-sectional area of the local doped region 6 may be $1\times10^{-8}$ mm$^2$, $0.5\times10^{-7}$ mm$^2$, $1\times10^{-7}$ mm$^2$, $0.5\times10^{-6}$ mm$^2$, or $1\times10^{-6}$ mm$^2$, or other values in the above range, which is not limited herein.

When the cross-sectional area of the local doped region 6 is excessively small (e.g., less than $1\times10^{-8}$ mm$^2$), a contact area between the first electrode 5 and the doped conductive layer 3 may be excessively small, which is not conducive to the transportation of the carriers. When the cross-sectional area of the local doped region 6 is excessively large (e.g., greater than $1\times10^{-6}$ mm$^2$), the concentration of the doping element in the first electrode 5 is required to be increased, that is, more doping elements are required to be added to the electrode paste, resulting in a substantial increase in manufacturing difficulty and costs of the first electrode 5, but the carrier transport rate may not be significantly increased. Therefore, when the cross-sectional area of the local doped region 6 ranges from $1\times10^{-8}$ mm$^2$ to $1\times10^{-6}$ mm$^2$, the contact area between the first electrode 5 and the doped conductive layer 3 can be increased, the carrier transport rate can be increased, and the manufacturing costs of the solar cell can be reduced.

In some embodiments, as shown in FIG. 3, the first electrode 5 includes a body portion 51 and an extension portion 52 extending along the body portion 51 toward the doped conductive layer 3, the extension portion 52 is located in the intrinsic polycrystalline silicon layer 4 and/or the doped conductive layer 3. A gap exists between a top end of the extension portion 52 and the substrate 1, and the local doped region 6 covers the extension portion 52.

As shown in FIG. 3, the body portion 51 is arranged on the side of the intrinsic polycrystalline silicon layer 4 away from the doped conductive layer 3, and the body portion 51 is not in direct contact with the doped conductive layer 3, which can reduce damages to the field passivation layer and ensure that the first surface 1a has good passivation effect. The extension portion 52 is electrically connected to the body portion 51, both of which can play a role of transporting the carriers. The extension portion 52 extends along the body portion 51 toward the doped conductive layer 3, and the extension portion 52 is formed due to permeation of the electrode paste toward the doped conductive layer 3 during the sintering of the electrode paste. The intrinsic polycrystalline silicon layer 4 can prevent penetration of the extension portion 52 through the tunneling oxide layer 2, so that a gap exists between the top end of the extension portion 52 and the substrate 1. The local doped region 6 covers a surface of the extension portion 52 not in contact with the body portion 51, and can be connected to the intrinsic polycrystalline silicon layer 4 and the doped conductive layer 3, to realize an electrical connection between the extension portion 52 and the doped conductive layer 3.

In some embodiments, as shown in FIG. 3, the extension portion 52 includes a first part 521 and a second part 522, the first part 521 is connected to the body portion 51, a gap exists between the second part 522 and both the body portion 51 and the first part 521, one part of the local doped region 6 covers the first part 521, and the other part of the local doped region 6 covers the second part 522.

The extension portion 52 may be implemented in two forms, one of which is the first part 521 directly connected to the body portion 51 and the other is the second part 522 spaced from the body portion 51. The second part 522 is a crystal grain in a free state, and surfaces of the first part 521 and the second part 522 are covered with the local doped region 6 to ensure a stable electrical connection between the extension portion 52 and the doped conductive layer 3.

In some embodiments, as shown in FIG. 3, a thickness D2 of the doped conductive layer 3 satisfies: 10 nm≤D2≤80 nm. For example, the thickness D2 of the doped conductive layer 3 may be 10 nm, 30 nm, 50 nm, 70 nm, or 80 nm, or other values in the above range, which is not limited herein.

In one or more embodiments, when the thickness D2 of the doped conductive layer 3 is 10 nm≤D2≤80 nm, reliability of the electrical connection between the first electrode 5 and the doped conductive layer 3 can be ensured, the carrier transport rate can be increased, the light absorption capability of the doped conductive layer 3 can be reduced, thereby reducing optical loss of the solar cell and improving cell efficiency of the solar cell, and an overall thickness and weight of the solar cell can also be reduced, thereby facilitating mounting and transportation the solar cell.

In some embodiments, as shown in FIG. 1, the substrate 1 further has a second surface 1b arranged opposite to the first surface 1a, and the solar cell further includes an emitter 8, a second electrode 9, and a second passivation layer 10. The emitter 8 is arranged on the second surface 1b. A plurality of second electrodes 9 are arranged on one side of the emitter 8 away from the substrate 1, and the plurality of second electrodes 9 are electrically connected to the emitter 8. The second passivation layer 10 covers a surface of the emitter 8 away from the substrate 1.

Both the first surface 1a and the second surface 1b of the substrate 1 may be configured to receive incident light or reflected light. As shown in FIG. 1, the second surface 1b opposite to the first surface 1a is sequentially provided with the emitter 8, the second electrode 9, and the second passivation layer 10. When the substrate 1 is a P-type silicon substrate, the emitter 8 may be an N-type emitter, and the two may jointly form a PN junction structure. In some embodiments, when the substrate 1 is an N-type silicon substrate, the emitter 8 may be a P-type emitter. The function and effect of the second passivation layer 10 are close to the first passivation layer 7, which plays a role of performing passivation to the surface in contact therewith, thereby reducing recombination of carriers at the interface, improving transport efficiency of the carriers, and thus improving the photoelectric conversion efficiency of the solar cell.

In addition, as shown in FIG. 1, the second surface 1b of the substrate 1 may be arranged as a pyramid textured structure, so that reflectivity of the second surface 1b to incident light is reduced, and an absorption utilization rate of light is increased, thereby increasing the light transmission amount of the second surface 1b, and then improving the photoelectric conversion efficiency of the solar cell. The first surface 1a of the substrate 1 may be arranged as a non-pyramid textured structure, such as laminated step profile, so that the tunneling oxide layer 2 on the first surface 1a has higher density and uniformity, enabling the tunneling oxide Layer 2 to have good passivation effect on the substrate 1. In some embodiments, the first surface 1a may be a rear surface of the substrate 1, that is, a surface of the substrate 1 facing away from the sun. Correspondingly, the second surface 1b may be a front surface of the substrate 1, that is, a surface of the substrate 1 facing the sun and configured to receive sunlight. In some embodiments, the first surface 1a may also be the front surface of the substrate 1, and correspondingly, the second surface 1b may also be the rear surface of the substrate 1.

Figure 4:
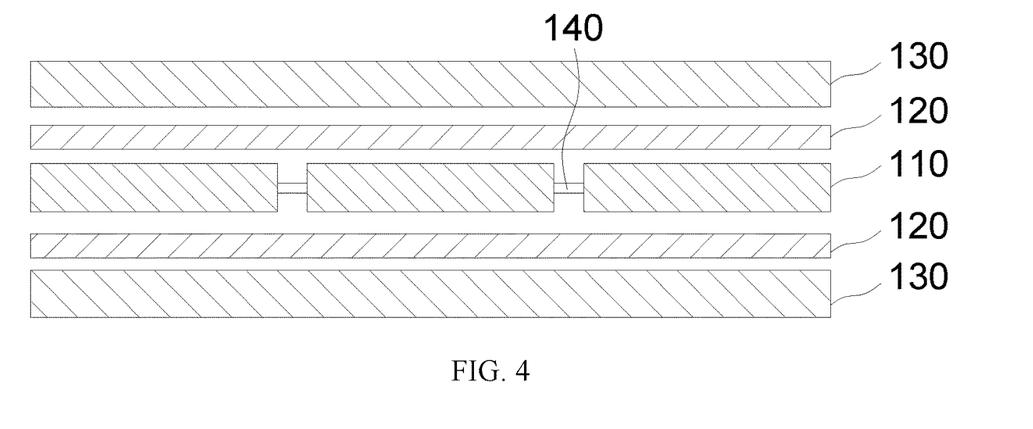
FIG. 4 is a schematic structural diagram of a photovoltaic module according to one or more embodiments of the present disclosure.

Some embodiments of the present disclosure provide a photovoltaic module. As shown in FIG. 4, the photovoltaic module includes a solar cell string 110, a packaging layer 120, and a cover plate 130. The solar cell string 110 is formed by connecting a plurality of solar cells. The solar cells each are the solar cell described in the above embodiments. The packaging layer 120 is configured to cover a surface of the solar cell string 110. The cover plate 130 is configured to cover a surface of the packaging layer 120 away from the solar cell string 110.

As shown in FIG. 4, the solar cells are electrically connected in the form of an entire piece or a plurality of cuts to form a plurality of solar cell strings 110, and the plurality of solar cell strings 110 are electrically connected in series and/or in parallel. In some embodiments, the plurality of solar cell strings 110 may be electrically connected through conductive strips 140. The packaging layer 120 covers a front surface and a rear surface of the solar cell. In some embodiments, the packaging layer 120 may be an organic packaging adhesive film such as an ethylene vinyl acetate copolymer (EVA) adhesive film, a polyethylene octene co-elastomer (POE) adhesive film, a polyethylene terephthalate (PET) adhesive film, or polyvinyl butyral (PVB). The cover plate 130 may be a cover plate 130 with a light-transmitting function such as a glass cover plate or a plastic cover plate. In some embodiments, the surface of the cover plate 130 facing the packaging layer 120 may be a concave-convex surface, thereby increasing the utilization rate of the incident light.

The solar cell is provided with the intrinsic polycrystalline silicon layer 4, which can prevent the tunneling oxide layer 2 from being damaged by the first electrode 5, improving the photoelectric conversion efficiency of the solar cell, and thus photoelectric conversion efficiency of the photovoltaic module including the solar cell can also be improved.

The above are merely preferred embodiments of the present disclosure and are not intended to limit the present disclosure. For those skilled in the art, the present disclosure may be subject to various changes and variations. Any modification, equivalent replacement, improvement, and the like made within the spirit and principles of the present disclosure shall fall within the protection scope of the present disclosure.

What is claimed is:

1. A solar cell, comprising:
   a substrate including a first surface;
   a tunneling oxide layer covering the first surface;
   a doped conductive layer covering a surface of the tunneling oxide layer away from the substrate;
   an intrinsic polycrystalline silicon layer formed on one side of the doped conductive layer away from the tunneling oxide layer;
   a first passivation layer; and
   a plurality of first electrodes arranged on one side of the intrinsic polycrystalline silicon layer away from the doped conductive layer and electrically connected to the doped conductive layer,
   wherein at least a portion of each first electrode is located in the intrinsic polycrystalline silicon layer, and a gap is defined between a top end of each first electrode and the substrate, and
   wherein the intrinsic polycrystalline silicon layer includes a plurality of covering portions spaced apart from one another, and each covering portion is between the doped conductive layer and a respective one of the plurality of first electrodes, and wherein the first passivation layer includes a first part covering the plurality of covering portions and a second part in direct contact with the doped conductive layer.

2. The solar cell according to claim 1, wherein a thickness D1 of the intrinsic polycrystalline silicon layer satisfies: 10 nm≤D1≤80 nm.

3. The solar cell according to claim 1, further comprising:
   local doped regions connected to the plurality of first electrodes, the intrinsic polycrystalline silicon layer, and the doped conductive layer, respectively, so that the plurality of first electrodes are electrically connected to the doped conductive layer.

4. The solar cell according to claim 1, wherein a concentration of a doping element in the doped conductive layer ranges from $1\times10^{20}$ atoms/cm$^3$ to $1\times10^{21}$ atoms/cm$^3$.

5. The solar cell according to claim 3, wherein a concentration of a doping element in each local doped region ranges from $1\times10^{19}$ atoms/cm$^3$ to $1\times10^{20}$ atoms/cm$^3$.

6. The solar cell according to claim 3, wherein a cross-sectional area of each local doped region ranges from $1\times10^{-8}$ mm$^2$ to $1\times10^{-6}$ mm$^2$.

7. The solar cell according to claim 3, wherein a first electrode of the plurality of first electrodes includes a body portion and an extension portion extending along the body portion toward the doped conductive layer; and
   the extension portion is located in the intrinsic polycrystalline silicon layer and/or the doped conductive layer, a gap is defined between a top end of the extension portion and the substrate, and one or more of the local doped regions cover the extension portion.

8. The solar cell according to claim 7, wherein the extension portion includes a first part and a second part, the first part is connected to the body portion, and a gap is defined between the second part and both the body portion and the first part; and
   a first local doped region of the local doped regions covers the first part, and a second local doped region of the local doped regions covers the second part.

9. The solar cell according to claim 1, wherein a thickness D2 of the doped conductive layer satisfies: 10 nm≤D2≤80 nm.

10. The solar cell according to claim 1, wherein the substrate further includes a second surface arranged opposite to the first surface; and
    the solar cell further comprises:
    an emitter arranged on the second surface;
    a plurality of second electrodes arranged on one side of the emitter away from the substrate and electrically connected to the emitter; and
    a second passivation layer covering a surface of the emitter away from the substrate.

11. A photovoltaic module, comprising:
    a solar cell string formed by connecting a plurality of solar cells;
    a front packaging layer configured to cover a front surface of the solar cell string;
    a back packaging layer configured to cover a back surface of the solar cell string;
    a front cover plate configured to cover a surface of the front packaging layer away from the solar cell string; and
    a back cover plate configured to cover a surface of the back packaging layer away from the solar cell string,
    wherein at least one of the plurality of solar cells includes:
    a substrate including a first surface;
    a tunneling oxide layer covering the first surface;
    a doped conductive layer covering a surface of the tunneling oxide layer away from the substrate;
    an intrinsic polycrystalline silicon layer formed on one side of the doped conductive layer away from the tunneling oxide layer;
    a first passivation layer; and
    a plurality of first electrodes arranged on one side of the intrinsic polycrystalline silicon layer away from the doped conductive layer and electrically connected to the doped conductive layer,
    wherein at least a portion of each first electrode is located in the intrinsic polycrystalline silicon layer, and a gap is defined between a top end of each first electrode and the substrate and
    wherein the intrinsic polycrystalline silicon layer includes a plurality of covering portions spaced apart from one another, and each covering portion is between the doped conductive layer and a respective one of the plurality of first electrodes, and wherein the first passivation layer includes a first part covering the plurality of covering portions and a second part in direct contact with the doped conductive layer.

12. The photovoltaic module according to claim 11, wherein the solar cell further comprises:

local doped regions connected to the plurality of first electrodes, the intrinsic polycrystalline silicon layer, and the doped conductive layer, respectively, so that the plurality of first electrodes are electrically connected to the doped conductive layer.

13. The solar cell according to claim 1, wherein each first electrode is spaced apart from the tunneling oxide layer.

14. The solar cell according to claim 1, wherein a first electrode of the plurality of first electrodes includes a body portion and an extension portion extending from the body portion, and the extension portion includes first parts and second parts, the first parts are connected to the body portion, the second parts are spaced apart from the first parts, one of the first parts is located in the intrinsic polycrystalline silicon layer and physically spaced part from the doped conductive layer, another one of the first parts is located in the intrinsic polycrystalline silicon layer and the doped conductive layer.

15. The solar cell according to claim 14, further comprising local doped regions in the intrinsic polycrystalline silicon layer, wherein the plurality of first electrodes are formed by sintering of metal electrode paste, the metal electrode paste contains doped elements, the local doped regions are formed by the doped elements from the metal electrode paste in the sintering process, and the first part that is physically spaced part from the doped conductive layer is electrically connected to the doped conductive layer through one of the local doped regions.

* * * * *